United States Patent [19]

Ashmore, Jr.

[11] Patent Number: 5,010,522
[45] Date of Patent: Apr. 23, 1991

[54] INTEGRATED-CIRCUIT CONFIGURATION HAVING FAST LOCAL ACCESS TIME

[75] Inventor: Benjamin H. Ashmore, Jr., Houston, Tex.

[73] Assignee: Texas Instruments Incorporated, Dallas, Tex.

[21] Appl. No.: 443,293

[22] Filed: Nov. 29, 1989

Related U.S. Application Data

[63] Continuation of Ser. No. 279,758, Dec. 5, 1988, abandoned.

[51] Int. Cl.$^5$ ............................................. G11C 11/40
[52] U.S. Cl. .......................... 365/189.07; 365/189.05
[58] Field of Search ...................... 365/189.01, 189.07, 365/189.02, 189.04, 189.05

[56] References Cited

U.S. PATENT DOCUMENTS

| | | | |
|---|---|---|---|
| 3,771,145 | 11/1973 | Wiener | 340/173 |
| 4,330,852 | 5/1982 | Redwine et al. | 365/221 |
| 4,739,497 | 4/1988 | Itoh et al. | 365/230.06 |
| 4,817,058 | 3/1989 | Pinkham | 365/230 |

OTHER PUBLICATIONS

"TMS27C212 1,048,576-Bit BurstMode TM UV Erasable Programmable Read-Only Memory TMS27C212 1,048,576-Bit BurstMode TM Programmable Read-Only Memory", Texas Instruments Product Review 5/89, pp. 1-16.

Ashmore et al., "Session 2: High-Speed SRAMs WAM 2.8: A 20ns 1 Mb CMOS BurstMode EPROM", 1989 IEEE International Solid-State Circuits Conference, pp. 40-41.

Primary Examiner—Terrell W. Fears
Attorney, Agent, or Firm—Ronald O. Neerings; Thomas W. DeMond; Melvin Sharp

[57] ABSTRACT

An integrated-circuit memory-array configuration for providing less total access time when used in conjunction with a microprocessor. The configuration includes a line buffer with perhaps 256 latches for storing data, and first and second pipeline circuits for sensing linearity and locality of access information pertaining to the requested data. When used with a microprocessor that is programmed with repeated requests for the same data, a majority of the data requests will be transmitted quickly from the line buffer. If the data requests are not in the line buffer, the configuration furnishes a signal to the microprocessor and the requested data are moved from the floating-gate memory cell array to the line buffer for subsequent transmittal to the microprocessor.

37 Claims, 1 Drawing Sheet

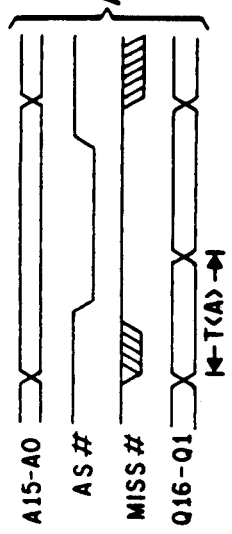
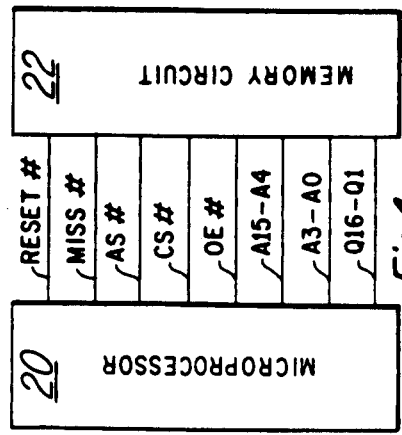
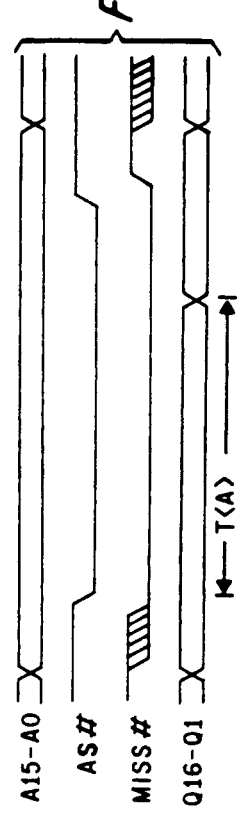
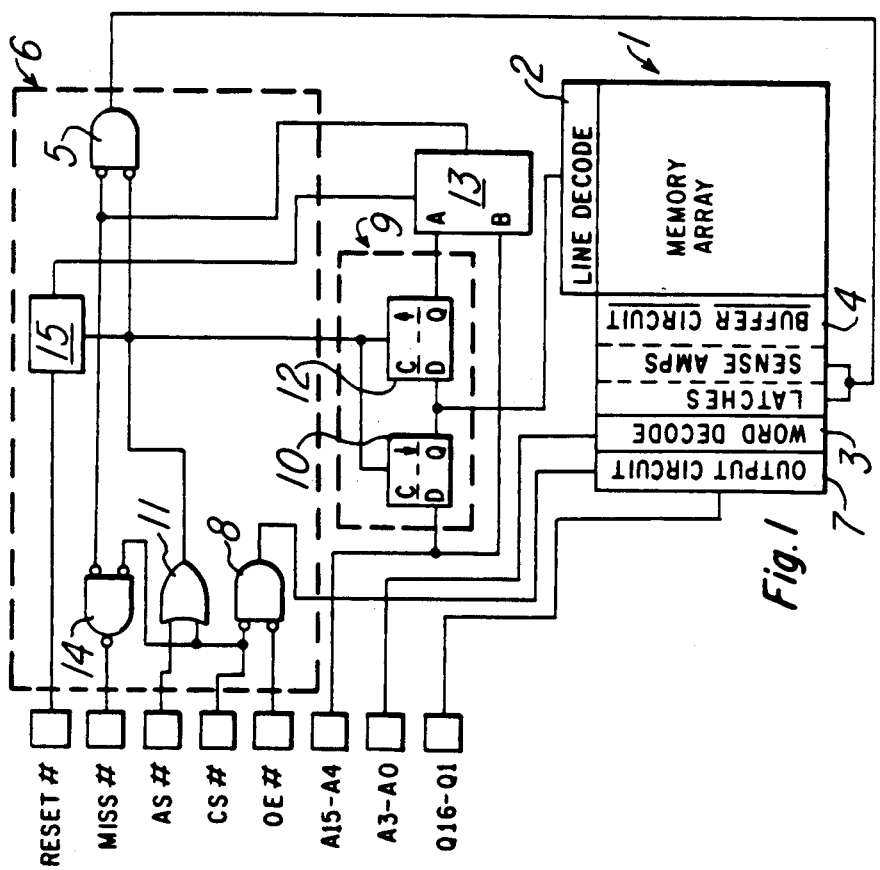

INTEGRATED-CIRCUIT CONFIGURATION HAVING FAST LOCAL ACCESS TIME

This is a continuation of application Ser. No. 07/279,758, filed Dec. 5, 1988, now abandoned.

BACKGROUND OF THE INVENTION

This invention relates to integrated circuits with memory arrays and, in particular, to circuits for decreasing the time interval between the request from a microprocessor for access to data stored in such memory arrays and the subsequent transmission of such data to the microprocessor.

Improvements in microprocessor speeds of performance have been outpacing corresponding improvements in access time for high-density, non-volatile, semiconductor memories, such as EPROMs. The disparity in required-versus-available memory-array access time has grown larger as a result of recently developed digital-signal-processor (DSP) and reduced-instruction-set-computer (RISC) microprocessor architectures. To utilize a microprocessor's performance capability fully, system designers have resorted to complex architectures such as memory interleaving and high speed static-random-access-memory (SRAM) caches. The alternative has been to compromise system performance by slowing microprocessor access to memory arrays through use of wait states, which previously have been required for every access. Accordingly, there is a need for an improved integrated memory array configuration that minimizes total access time for use in microprocessor system applications without resort to complex circuit architectures.

Studies have shown that microprocessor code typically exhibits a high degree of both linearity and locality. Many microprocessor architectures linearize memory access requests because of on-chip cache burst fill modes or because of instruction pre-fetch queues. When using those microprocessor modes or architectures, a large percentage of total access time involves accessing relatively small part of the data stored in a memory array during a relatively large percentage of the address sequences.

SUMMARY OF THE INVENTION

The integrated circuit memory array configuration of this invention provides improved access time through use of a statistical approach to performance enhancement and is marketed under the "BURSTMODE" trademark. Specifically, an example electrically-programmable, read-only-memory (EPROM) described in this invention is organized as a 64K×16*b* non-volatile memory array and contains an on-chip 32-byte line buffer circuit and a control logic circuit that take advantage of instruction and data stream linearity and locality. Access to memory locations is considered "local" if the required instruction or data address remains within the current address range of the contents in the line buffer circuit. These "local" data are stored in the line buffer and may be accessed very quickly by the microprocessor, typically within 20 nanoseconds. When a memory cycle requests "non-local" data that are not stored in the line buffer, wait states are needed to allow time to reload the line buffer circuit, which typically occurs within 70 nanoseconds. Because of the predominately linear memory access sequences and because of the large degree of "local" address data requests, the ratio of "local" data requests to "non-local" data requests is high in many microprocessor applications. In these applications, the average program execution time using the configuration of this invention approaches the execution time that would be achieved through use of a high-speed, absolute-access-time, non-volatile memory. To simplify system integration and to reduce the number of external parts, the configuration of this invention contains on-chip logic to transmit a "miss" signal to the microprocessor in the event that wait states are needed during reload of the line buffer circuit, transforming "non-local" data to "local" data.

BRIEF DESCRIPTION OF THE DRAWINGS

The novel features of this invention are set forth in the appended claims. The invention, its features, and its advantages are described below in conjunction with the following drawings:

FIG. 1 is a representation, in block diagram form, of the configuration of this invention.

FIG. 2 is a representation of memory access hit signals and of corresponding transition signals of this invention.

FIG. 3 is a representation of memory access miss signals and of corresponding transition signals of this invention.

FIG. 4 is a representation, in block diagram form, of the system configuration of this invention.

DETAILED DESCRIPTION OF A SPECIFIC EMBODIMENT

Referring to FIG. 1, an embodiment of the non-volatile integrated memory circuit of this invention is shown with an output terminal MISS# that, upon receiving a request for data from a microprocessor, is high when the requested data are readily available (a "hit") and is low when the requested data are not readily available (a "miss"). The microprocessor transmits an address request for data to bus terminals A15-A4 and A3-A0. The part of the address designation that changes most during operation of a program is preferably transmitted to terminal A3-A0 and the part that changes least often is preferably transmitted to terminal A15-A4. A signal at address strobe input terminal AS# is received from a microprocessor and is normally high and drops to a low level at the time the microprocessor wishes to receive the requested data. Chip select terminal CS# receives a high inhibiting signal from the microprocessor if the memory array is not in use. Output enable terminal OE# receives a low signal from the microprocessor at the time the microprocessor accepts data from the memory array through bus terminal Q16-Q1.

The example integrated circuit configuration of FIG. 1 includes a memory array 1 of non-volatile memory cells, such as EPROMs, organized as a 64K×16*b* array, that includes a standard line-decode circuit 2, and that includes a standard word-decode circuit 3. The input/outputs may, for example, be organized in 128 rows and 512 columns. Line buffer circuit 4 is added to the standard memory array and may include, for example, 256 standard transparent latches grouped in 16 words of 16 bits each. Line buffer circuit 4 is transparent when a high signal is received from first AND circuit 5, which may be included in logic circuit 6. However, line buffer circuit 4 does not bypass information when the signal received from logic circuit 6 is low. The microprocessor selects certain contents of or one word from line buffer circuit 4 by transmitting data address information through terminal A3-A0 to word-decode circuit 3. Output circuit 7 transmits the selected contents of line buffer circuit 4, such as one 16 bit word, to output bus terminal Q16-Q1 when output circuit 7 is activated by a high signal at its triggering input from logic circuit 6, which may include second AND circuit 8. Logic circuit 6, which may include second AND circuit 8, is in turn activated, for example, by low signals from the microprocessor on both the output enable terminal OE# and the chip select terminal CS#.

First and second AND circuits 5 and 8 are shown as inverted input AND circuits, which, as is well-known, are equivalent to NOR circuits.

Pipeline latch circuit 9 is illustrated as including first pipeline latch 10, which in turn may include an array of D-type flip-flop circuits that store address information received from the microprocessor at higher order bus terminal A15-A4 upon detecting a first, perhaps falling, signal from the microprocessor at terminal AS# through OR circuit 11, which may be included in logic circuit 6 and which has its second input signal connected to chip select input CS#. Pipeline latch circuit 9, as illustrated, also includes second pipeline latch 12, which in turn may also include an array of D-type flip-flop circuits that store address information received from first pipeline latch 10 upon detecting a fourth, perhaps rising, pulse signal from the microprocessor at terminal AS# through OR circuit 11. Comparison circuit 13 has one set of inputs connected to bus terminals A15-A4 and the other set of inputs connected to the output of second pipeline latch 12. The output of comparison circuit 13 is connected to one of the inputs of first AND circuit 5 and to one of the inputs of NAND circuit 14, which may be included in logic circuit 6. The other input of first AND circuit 5 is connected to the output of OR circuit 11. The other input of NAND circuit 14 is connected to chip select terminal CS#. The output of NAND circuit 14 is connected to the MISS# terminal. Bus terminal A3-A0 is connected to word-decode circuit 3. The output of first pipeline latch 10 is connected to line-decode circuit 2.

OR circuit 11 may include a programmable element for inverting the input from terminal AS# to allow use of the device of this invention with microprocessors that have address strobe signals of opposite polarity than the example described here.

NAND circuit 14 is illustrated with inverted inputs and inverted output, which, as is well-known, is equivalent to an OR circuit. NAND circuit 14 may include a programmable element that allows logic circuit 6 to be programmed for use with a microprocessor that requires a high "miss" signal, rather than the low "miss" signal used in the illustrative embodiment described here.

On each memory access cycle from the microprocessor, a first signal, which may be a falling edge depending on the microprocessor characteristic, at terminal AS# loads the high order addresses A15-A4 into first pipeline latch 10. The address signals in first pipeline latch 10 are transferred to second pipeline latch 12 later in the memory cycle by a fourth signal, which may be a rising edge, at terminal AS#. Comparison circuit 13 continuously compares the address information received from the microprocessor at terminal A15-A4 with the addresses of the previous cycle stored in second pipeline latch 12. If the address information at the two locations is the same, the output of comparison circuit 13 is a second, or "non-miss", signal which is not transmitted to the microprocessor or to buffer circuit 4 by logic circuit 6. If the address information at the two locations is not the same, a third, or "miss", signal is asserted by comparison circuit 13. The third, or "miss", signal is transmitted to logic circuit 6, which sends the signal to the microprocessor and causes an internal memory access to reload line buffer circuit 4. If the microprocessor does not receive the third, or "miss", signal from logic circuit 6, the microprocessor transmits a fourth, or output enable, signal to terminal OE# at a preset relatively short time interval, perhaps 20 nanoseconds in length. If the microprocessor receives the third, or "miss", signal from logic circuit 6, the microprocessor transmits the fourth, or output enable, signal to terminal OE# at a preset relatively long time interval, perhaps 70 nanoseconds in length.

As shown in FIG. 1, a reset circuit 15 may be included in logic circuit 6 to ensure that the first memory access will, upon application of power to the device, always generate a "miss", thus triggering loading of the line buffer circuit 4.

The integrated-circuit configuration of this invention may have an internal data path consisting of perhaps 256 sense amplifiers and 256 data latches included in line buffer circuit 4. During a memory cycle when MISS# is asserted, a row of memory array 1 and the 256 sense amplifiers are powered, the sense amplifiers read the data contents of the row of memory cells and the outputs of the sense amplifiers are read in parallel and stored in the data latches of line buffer circuit 4. Because the memory array described in the Figures is a 16 bit input-output device, this equates to the data in 16 adjacent and addressable memory locations (addressed by A3-A0) being stored in the line buffer circuit 4.

Referring to FIG. 2, the signal at bus terminals A15-A4 and A3-A0 is indicated as undergoing transitions at the points marked "X". After the first transition, the signal at terminal MISS# remains high, indicating that the information stored in the requested address is stored in line buffer circuit 4. After the signals at bus terminals A3-A0 have stabilized, the requested data is transmitted to terminal Q16-Q1 from line buffer circuit 4 in a relatively short period of time T(A), measured from the last transition.

Referring to FIG. 3, the signal at bus terminals A15-A4 and A3-A0 is again indicated as undergoing transitions at the points marked "X". After the first transition, the signal at terminal MISS# decreases in value, indicating that the information stored in the requested address is not stored in line buffer circuit 4. When the activating signal at terminal AS# decreases to a lower value, the requested data is not transmitted to terminal Q16-Q1 until after completion of a non-local wait state needed to reload line buffer circuit 4. A relatively longer period of time T(A), measured from the transition, is indicated.

Referring to FIG. 4, the microprocessor 20 and memory circuit 22 transmit and receive the signals identified in FIG. 1 over leads extending between processor 20 and memory circuit 22.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. An integrated circuit with memory array including:
   a pipeline circuit connected to a microprocessor for storing data address information received from a microprocessor upon receipt of a first signal from a microprocessor;
   a comparison circuit connected to the input of said pipeline circuit and to the output of said pipeline circuit for generating a second signal if the data address information received from said microprocessor is the same as the data address information stored in said pipeline circuit and for generating a third signal if the data address information received from said microprocessor is different from the data address information stored in said pipeline circuit;
   a line buffer circuit for selectively storing data corresponding to said data address information stored in said pipeline circuit;
   a logic circuit connected to said comparison circuit, to said line buffer circuit and to said microprocessor for transmitting said third signal to said microprocessor and to said line buffer circuit, but not transmitting said second signal; and
   an output circuit connected to said line buffer circuit and to said microprocessor for transmitting said data to said microprocessor upon receiving a fourth signal from said microprocessor;
   wherein said third signal causes said microprocessor to delay transmission of said fourth signal until after said data address information received from said microprocessor has been stored in said pipeline circuit and after data corresponding to said received data address information has been stored in said pipeline circuit.

2. The integrated circuit of claim 1 wherein said pipeline circuit includes a first pipeline latch connected to said microprocessor for storing data address information received from said microprocessor upon receipt of a first signal from said microprocessor and includes a second pipeline latch connected to said first pipeline latch for storing address information received from said first pipeline circuit upon receipt of a second signal from said microprocessor.

3. The integrated circuit of claim 1 wherein said line buffer circuit includes latch circuits.

4. The integrated circuit of claim 1 wherein said line buffer circuit includes sense amplifiers.

5. The integrated circuit of claim 1 wherein said logic circuit includes a first AND circuit with one input connected to the output of said comparison circuit, with another input connected to receive an address strobe signal from said microprocessor, and with output connected to said buffer circuit.

6. The integrated circuit of claim 1 wherein said logic circuit includes a NAND circuit with one input connected to the output of said comparison circuit, with the other input connected to receive a chip select signal from said microprocessor, and with output connected to transmit a "miss" signal to said microprocessor.

7. The integrated circuit of claim 1 wherein said logic circuit includes a second AND circuit with one input connected to receive a chip select signal from said microprocessor, with the other input connected to receive an output enable signal from said microprocessor, and with output connected to the triggering input of said output circuit.

8. The integrated circuit of claim 1 wherein said logic circuit includes an OR circuit with one input connected to receive an address strobe signal from said microprocessor, with the other input connected to receive a chip select signal from said microprocessor, and with output connected to an input of said pipeline circuit.

9. The integrated circuit of claim 1 wherein said logic circuit includes a reset circuit with input connected to receive a reset signal and with outputs connected to said pipeline circuit and to said comparison circuit for the purpose of causing said buffer circuit to be loaded with data during initial operation of said integrated circuit.

10. The integrated circuit of claim 1 wherein said memory array includes EPROMs.

11. A circuit for decreasing microprocessor access time to a memory array, comprising:
    a pipeline circuit connected to said microprocessor for storing data access information received from said microprocessor upon receipt of a first signal from said microprocessor;
    a comparison circuit connected to the input of said pipeline circuit and the output of said pipeline circuit for generating a second signal if the data address information received from said microprocessor is the same as the data address information stored in said pipeline circuit and for generating a third signal if the data is different from the data address information stored in said pipeline circuit;
    a line buffer circuit for selectively storing data corresponding to said data address information stored in said pipeline circuit;
    a logic circuit connected to said comparison circuit, to said line buffer circuit and to said microprocessor for transmitting a third signal to said microprocessor and to said line buffer circuit; and
    an output circuit connected to said line buffer circuit and to said microprocessor for transmitting said data to said microprocessor upon receiving a fourth signal from said microprocessor;
    wherein said third signal causes said microprocessor to delay transmission of said fourth signal until after said pipeline circuit has been reloaded with said address information received from said microprocessor and after said line buffer has been reloaded with data corresponding to said received address information.

12. The circuit of claim 11 wherein said line buffer circuit includes sense amplifiers.

13. The circuit of claim 11 wherein said line buffer circuit includes latch circuits.

14. The circuit of claim 11 wherein said logic circuit includes a first AND circuit with one input terminal connected to the output of said comparison circuit, with the second input connected to receive and address strobe signal from said microprocessor, and with output connected to said buffer circuit.

15. The circuit of claim 11 wherein said logic circuit includes a NAND circuit with one input connected to the output of said comparison circuit, with the second input connected to receive a chip select signal from said microprocessor, and with output connected to transmit a "miss" signal to said microprocessor.

16. The circuit of claim 11 wherein said logic circuit includes a second AND circuit with one input connected to receive a chip select signal from said microprocessor, with the second input connected to receive an output enable signal from said microprocessor, and with output connected to a triggering input of said output circuit.

17. The circuit of claim 11 wherein said logic circuit includes an OR circuit with one input connected to receive an address strobe signal from said microprocessor, with the second input connected to receive a chip select signal from said microprocessor, and with output connected to an input of said pipeline circuit.

18. The circuit of claim 11 wherein said logic circuit includes a reset circuit with input connected to receive a reset signal and with outputs connected to said pipeline circuit and to said comparison circuit for causing said buffer circuit to be loaded with data during initial operation.

19. The circuit of claim 11 wherein said memory array includes EPROMs.

20. A memory circuit presenting data at output terminals in response to receiving address information and control signals, said memory circuit comprising:
   an array of memory cells capable of storing data;
   sense amplifiers connected to said array of memory cells; and
   a line buffer of data latches connected between said sense amplifiers and said output terminals, each data latch being connected between one sense amplifier and one data terminal, in response to receipt of certain address information and control signals, said memory circuit transmitting data in parallel from adjacent data latches of said line buffer of data latches to said output terminals and, in receipt of other address information, said memory circuit transmitting data in parallel from said memory array through said sense amplifiers to said line buffer of data latches for later transmission to said output terminals.

21. The memory circuit of claim 20 in which said data latches are arranged in selectable groups and said address information selects one group of said data latches for transmitting data to said output terminals.

22. The memory circuit of claim 20 including control circuits connected to said address information, said control signals, said sense amplifiers and said line buffer of data latches for storing the addresses of data stored in said line buffer and comparing said received address information to said stored addresses in determining whether to transmit data in said data latches to said output terminals and transmitting data from said memory cells to said data latches for later transmission to said output terminals.

23. The memory circuit of claim 22 in which said control circuits transmit a MISS signal upon said address information indicating data not in said line buffer of data latches.

24. The memory circuit of claim 22 in which said control circuits include a reset circuit for transmitting data from said array through said sense amplifiers to said data latches upon power up.

25. The memory circuit of claim 20 in which said memory cells are non-volatile.

26. The memory circuit of claim 20 in which said memory cells form electrically-programmable, read-only-memory.

27. The memory circuit of claim 20 in which said array of memory cells are arranged in rows and columns, said columns presently plural words of data and said address information addressing individual ones of said words of data in said line buffer.

28. The memory circuit of claim 27 in which said data latches are arranged in 16 words of data with 16 bits in each word.

29. A processor system comprising:
   a processor presenting address signals on parallel address terminals and control signals on control terminals for receiving requested data on parallel data terminals; and
   a memory circuit connected to said address terminals, control terminals and data terminals, said memory circuits including an array of memory cells capable of storing data, sense amplifiers connected to said array of memory cells and a line buffer of data latches connected between said sense amplifiers and said output terminals, each data latch being connected between a sense amplifier and a data terminal, in response to receipt of certain address information and control signals, said memory circuit transmitting data in parallel from adjacent data latches of said line buffer of data latches to said output terminals and, in receipt of other address information, said memory circuit transmitting data in parallel from said memory array through said sense amplifiers to said line buffer of data latches for later transmission to said output terminals.

30. The memory circuit of claim 29 in which said data latches are arranged in selectable groups and said address signals select one group of said data latches for transmitting data to said data terminals.

31. The memory circuit of claim 29 in which said memory circuit includes control circuits connected to said address terminals, said control terminals, said sense amplifiers and said line buffer of data latches for storing the addresses of data stored in said line buffer and comparing said received address signals to said stored addresses in determining whether to transmit data in said data latches to said output terminals and transmitting data from said memory cells to said data latches for later transmission to said output terminals.

32. The memory circuit of claim 31 in which said control circuits transmit a MISS signal to said control terminals upon said address signals indicating data not in said line buffer of data latches.

33. The memory circuit of claim 31 in which said control circuits include a reset circuit for transmitting data from said array through said sense amplifiers to said data latches upon power up.

34. The memory circuit of claim 29 in which said memory cells are non-volatile.

35. The memory circuit of claim 29 in which said memory cells form electrically-programmable, read-only-memory.

36. The memory circuit of claim 29 in which said array of memory cells are arranged in rows and columns, said columns presenting plural words of data and said address signals addressing individual ones of said words of data in said line buffer.

37. The memory circuit of claim 27 in which said data latches are arranged in 16 words of data with 16 bits in each word.

* * * * *